United States Patent
Jiang

(10) Patent No.: US 10,510,959 B2
(45) Date of Patent: Dec. 17, 2019

(54) COMMISSIONING METHOD AND VAPOR DEPOSITION MACHINE

(71) Applicant: Wuhan China Star Optoelectronics Semiconductor Display Technology Co., Ltd., Wuhan, Hubei (CN)

(72) Inventor: Qian Jiang, Guangdong (CN)

(73) Assignee: Wuhan China Star Optoelectronics Semiconductor Display Technology Co., Ltd., Wuhan, Hubei (CN)

(*) Notice: Subject to any disclaimer, the term of this patent is extended or adjusted under 35 U.S.C. 154(b) by 28 days.

(21) Appl. No.: 15/737,311

(22) PCT Filed: Oct. 20, 2017

(86) PCT No.: PCT/CN2017/106986
§ 371 (c)(1),
(2) Date: Dec. 17, 2017

(87) PCT Pub. No.: WO2019/037223
PCT Pub. Date: Feb. 28, 2019

(65) Prior Publication Data
US 2019/0067581 A1 Feb. 28, 2019

(30) Foreign Application Priority Data
Aug. 22, 2017 (CN) .......................... 2017 1 0738931

(51) Int. Cl.
*C23C 14/24* (2006.01)
*H01L 51/00* (2006.01)
(Continued)

(52) U.S. Cl.
CPC ........ *H01L 51/0012* (2013.01); *C23C 14/042* (2013.01); *C23C 14/24* (2013.01);
(Continued)

(58) Field of Classification Search
CPC .................................................. H01L 51/0012
See application file for complete search history.

(56) References Cited

U.S. PATENT DOCUMENTS

| 4,355,892 A | 10/1982 | Mayer et al. |
| 7,835,001 B2 * | 11/2010 | Kwack ................ G03F 7/70791 348/95 |

(Continued)

FOREIGN PATENT DOCUMENTS

| CN | 102650819 A | 8/2012 |
| CN | 103105741 A | 5/2013 |

(Continued)

*Primary Examiner* — David P Turocy
(74) *Attorney, Agent, or Firm* — Andrew C. Cheng

(57) ABSTRACT

The present invention discloses a commissioning method and a vapor deposition machine, the method is used for adjusting the relative position of a precision mask plate and a substrate to be operated, which comprises: loading a commissioning substrate into a vapor deposition chamber for commissioning; loading a precision mask plate into the vapor deposition chamber for commissioning; turning on the light source in the vapor deposition chamber for commissioning, and irradiating the photochromic layer on the commissioning substrate via the precision mask plate, wherein a partial position of the irradiated photochromic layer is discolored; obtaining a compensation value of the precision mask plate by the location of a partial discolored position of the photochromic layer. The method is possible to omit the organic materials during the commissioning process, and increase the commissioning speed.

10 Claims, 3 Drawing Sheets

(51) Int. Cl.
*C23C 14/04* (2006.01)
*C23C 14/54* (2006.01)
*H01L 51/56* (2006.01)

(52) U.S. Cl.
CPC ............ *C23C 14/54* (2013.01); *H01L 51/001* (2013.01); *H01L 51/0011* (2013.01); *H01L 51/56* (2013.01)

(56) References Cited

U.S. PATENT DOCUMENTS

| | | | |
|---|---|---|---|
| 2004/0063596 A1* | 4/2004 | Gabric | .................... G03F 7/105 510/176 |
| 2009/0170024 A1* | 7/2009 | Hennig | ............... G03F 7/70633 430/270.1 |
| 2010/0245997 A1 | 9/2010 | Shinohara et al. | |
| 2015/0251205 A1 | 9/2015 | Hirobe et al. | |

FOREIGN PATENT DOCUMENTS

| | | | |
|---|---|---|---|
| CN | 204714884 U | | 10/2015 |
| CN | 106129270 A | * | 11/2016 |
| CN | 106129270 A | | 11/2016 |
| CN | 106338892 A | | 1/2017 |
| JP | 2016053194 A | | 4/2016 |

\* cited by examiner

COMMISSIONING METHOD AND VAPOR DEPOSITION MACHINE

FIELD OF THE INVENTION

The present invention relates to a technology of display, and more particularly, to a commissioning method and a vapor deposition machine

DESCRIPTION OF PRIOR ART

Organic light emitting diode (OLED) display panel with active light, high brightness, high contrast, ultra-thin, low power consumption, large viewing angle, wide operating temperature range and many other advantages, is a widely used new flat display device.

In the preparation process of OLED display panel, it needs vapor deposition technology to prepare OLED film. Specifically, heating an organic material in a vacuum environment so that the organic material is sublimated by heat, and an organic thin film (i.e., a light emitting layer) having a certain shape is formed on an anode pattern corresponding to the subpixels of substrate by a patterned precision mask plate. Wherein subpixels of different colors correspond to different precision mask plates, subpixels for each color require a precision mask plate. After the continuous deposition of a variety of materials into a film, a multi-layer structure of the OLED structure can be formed. Currently, when a precision mask plate is aligned with a substrate to be operated, the alignment accuracy can usually be controlled in the range of $<\pm 3$ μm. However, even if the alignment is reached, the actual position of the organic thin film deposited on the subpixel anode pattern is shifted, when the display panel is lit, it is prone to occur a color mixing effect. Therefore, before the fully automated production, the location of precision mask plate must be compensated, so that after the film is formed, the film-forming pattern covers the subpixel anode pattern, and the anode pattern is in the center of the film-forming pattern.

The existing method of adjusting the film-forming pattern location of the precision mask plate is a waste of the material for film-forming, and the commissioning speed is slow.

SUMMARY OF THE INVENTION

The technical problem that the present invention mainly solves is to provide a commissioning method for adjusting the relative position of a precision mask plate and a substrate to be operated, it is possible to omit the organic materials during the process of adjusting the relative position of a precision mask plate and a substrate to be operated, and increase the commissioning speed.

In order to solve the above-mentioned technical problem, a technical solution adopted by the present invention is to provide a commissioning method for adjusting the relative position of a precision mask plate and a substrate to be operated, wherein which comprises: loading a commissioning substrate into a vapor deposition chamber for commissioning, wherein the commissioning substrate comprises a substrate, and the commissioning substrate further comprises a photochromic layer and an anode thin film layer arranged on the substrate, and one of the photochromic layer and the anode thin film layer is pre-patterned; loading the precision mask plate into the vapor deposition chamber for commissioning, wherein the precision mask plate comprises a light transmission area and the light blocking area; after aligning the precision mask plate and the commissioning substrate, turning on the light source in the vapor deposition chamber for commissioning, and irradiating the photochromic layer on the commissioning substrate via the precision mask plate, wherein a partial position of the irradiated photochromic layer is discolored; obtaining a compensation value of the precision mask plate by the location of a partial discolored position of the photochromic layer, wherein the compensation value is used for the vapor deposition machine to adjust the relative position of the precision mask plate and the substrate to be operated.

Wherein when the photochromic layer on the commissioning substrate is pre-patterned, the patterned photochromic layer is arranged on the anode thin film layer; the above-mentioned description of turning on the light source in the vapor deposition chamber for commissioning and irradiating the photochromic layer on the commissioning substrate via the precision mask plate, which comprises: the irradiation light passing through the light transmission area in the precision mask plate and irradiating the patterned photochromic layer, so that the discoloration phenomenon is occurred in the position corresponding to the light transmission area in the patterned photochromic layer; wherein the position where the discoloration phenomenon occurs in the photochromic layer is a position between the edge of the light transmissive area of the precision mask plate and the edge of the patterned photochromic layer.

Wherein when the anode thin film layer on the commissioning substrate is pre-patterned, the patterned anode thin film layer is arranged on the photochromic layer; the above-mentioned description of turning on the light source in the vapor deposition chamber for commissioning and irradiating the photochromic layer on the commissioning substrate via the precision mask plate, which comprises: the irradiation light passing through the light transmission area in the precision mask plate and the patterned anode thin film layer, and irradiating the photochromic layer, so that the discoloration phenomenon is occurred in a partial position of the irradiated photochromic layer; wherein the discoloration phenomenon occurs in the photochromic layer is a position between the edge of the light transmissive area of the precision mask plate and the edge of the patterned anode thin film layer.

In order to solve the above-mentioned technical problem, another technical solution adopted by the present invention is to provide a commissioning method for adjusting the relative position of a precision mask plate and a substrate to be operated, wherein which comprises: loading a commissioning substrate into a vapor deposition chamber for commissioning, wherein the commissioning substrate comprises a substrate, and the commissioning substrate further comprises a photochromic layer and an anode thin film layer arranged on the substrate, and one of the photochromic layer and the anode thin film layer is pre-patterned; loading the precision mask plate into the vapor deposition chamber for commissioning, wherein the precision mask plate comprises a light transmission area and the light blocking area; after aligning the precision mask plate and the commissioning substrate, turning on the light source in the vapor deposition chamber for commissioning, and irradiating the photochromic layer on the commissioning substrate via the precision mask plate, wherein a partial position of the irradiated photochromic layer is discolored; obtaining a compensation value of the precision mask plate by the location of a partial discolored position of the photochromic layer, wherein the compensation value is used for the vapor deposition machine to adjust the relative position of the precision mask plate and the substrate to be operated.

In order to solve the above-mentioned technical problem, a technical solution adopted by the present invention is further to provide a vapor deposition machine, wherein which comprises a plurality of normal working vapor deposition chambers and at least one vapor deposition chamber for commissioning, wherein the vapor deposition chamber for commissioning is used to obtain a compensation value of precision mask plate, and the compensation value is for the vapor deposition machine to adjust the relative position of the precision mask plate and the substrate to be operated in the normal working vapor deposition chamber; wherein the commissioning method for obtaining the compensation value of the precision mask plate by the vapor deposition chamber for commissioning, which comprises: loading a commissioning substrate into the vapor deposition chamber for commissioning, wherein the commissioning substrate comprises a substrate, and the commissioning substrate further comprises a photochromic layer and an anode thin film layer arranged on the substrate, and one of the photochromic layer and the anode thin film layer is pre-patterned; loading the precision mask plate into the vapor deposition chamber for commissioning, wherein the precision mask plate comprises a light transmission area and the light blocking area; after aligning the precision mask plate and the commissioning substrate, turning on the light source in the vapor deposition chamber for commissioning, and irradiating the photochromic layer on the commissioning substrate via the precision mask plate, wherein a partial position of the irradiated photochromic layer is discolored; obtaining a compensation value of the precision mask plate by the location of a partial discolored position of the photochromic layer.

The present invention can be concluded with the following advantages, the method provided by the present invention is different from the prior art by obtaining a compensation value of precision mask plate by the location of a partial discolored position of the photochromic layer in the commissioning substrate, and then the vapor deposition machine adjusts the relative position of a precision mask plate and a substrate to be operated by the compensation value. The above-mentioned method can replace the traditional method that the vapor deposition machine obtains a compensation value. By the method, it is possible to omit expensive organic materials during the commissioning process and increase the commissioning speed.

BRIEF DESCRIPTION OF DRAWINGS

In order to give a better and thorough understanding to the whole and other intended purposes, features and advantages of the technical solution of the present invention, detailed description will be given with respect to preferred embodiments provided and illustrated here below in accompanied drawings. Apparently, with the spirit of the embodiments disclosed, person in the skilled in the art can readily come out with other modifications as well as improvements without undue experiment. In addition, other drawings can be readily achieved based on the disclosed drawings.

DESCRIPTION OF PREFERRED EMBODIMENT

Figure 1:
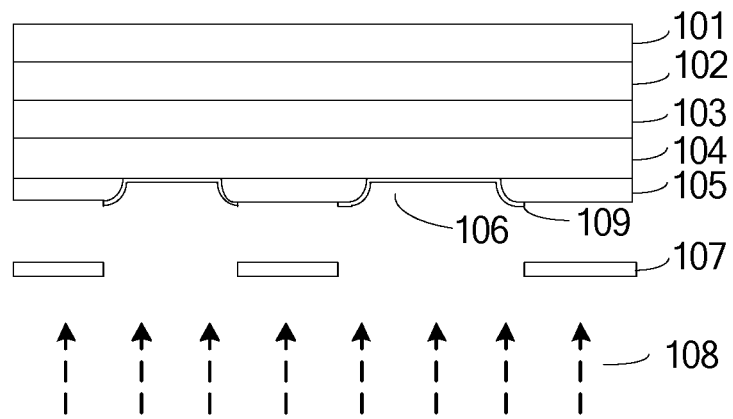
FIG. 1 is an illustrational view of a commissioning substrate and a precision mask plate during the commissioning process in general technology.

Referring to FIG. 1, FIG. 1 is an illustrational view of a commissioning substrate and a precision mask plate during the commissioning process in general technology. The commissioning substrate comprises: a substrate 101, a buffer layer 102, a metal layer 103, an anode thin film layer 104, and a photoresist layer 105.

The substrate 101 is a substrate having a glass substrate or a two-layer structure of a glass substrate and a polyimide film. The material of the buffer layer 102 is a nitride of silicon or an oxide of silicon, wherein the buffer layer 102 may be more than one layer, it may be two layers, the buffer layer 102 is described as a layer in FIG. 1. The metal layer 103 is a multilayer film layer formed of a metal molybdenum layer or a plurality of metals, for forming an alignment mark for the commissioning substrate. The anode thin film layer 104 is a multilayer structure of indium tin oxide and metallic silver, and the anode film layer 104 undergoes a process such as gumming, baking, exposure, development, etching, cleaning, etc. to form subpixels corresponding to the anode pattern. The photoresist layer 105 undergoes a process such as exposure, development and baking, and on which an opening 106 is formed to restrict the anode pattern required to form the anode film layer 104. The positions of the opening 106 and the anode pattern required to form the anode film layer 104 are the same.

When the precision mask plate is placed in a vapor deposition chamber of vapor deposition machine, the precision mask plate 107 is aligned with the commissioning substrate, to be an illustrational view as shown in FIG. 1. The lower organic material is heated and evaporated to form a material molecular gas stream 108 upward, and a thin film pattern 109 is formed on the commissioning substrate by a precision mask plate 107. Theoretically, the anode pattern exposed by the opening region 106 on the photoresist layer 105 should be positioned at the intermediate position of the film pattern 109. In the actual case, however, the film pattern 109 is partially offset due to the fabrication error of the precision mask plate.

Currently, an OLED display panel usually comprises three subpixels, which are red-light (R), green light (G), and blue light (B). Therefore, in the preparation process of OLED display panel, it needs to use three kinds of precision mask plate, subpixels of different colors correspond to different precision mask plates.

And the position of the precision mask plate is usually compensated by the following method.

A commissioning substrate and a precision mask plate corresponding a subpixel (e.g., a red-light pixel) are loaded into a vapor deposition chamber of vapor deposition machine, and a thin film pattern is deposited on the anode pattern corresponding to the subpixel, the actual film pattern will be formed near the anode pattern corresponding to the subpixel. Measuring the distance between the four sides and the anode pattern corresponding to the subpixel, the compensation value of the subpixel corresponding to the precision mask plate is measured by a certain algorithm based on the measured data. Inputting the compensation value into the vapor deposition machine, replacing a new commissioning substrate, and forming a film again. Measuring the distance between the four sides and the anode pattern corresponding to the subpixel again, and determining again whether or not the anode pattern is formed at the middle of the film pattern. If the anode pattern is formed at the middle of the film pattern at this time, the compensation for the position of the precision mask plate is completed, or continue replacing a new commissioning substrate to deposit a film pattern by vapor deposition, until the anode pattern is formed at the middle of the film pattern. When the compensation of the precision mask plate corresponding to the subpixel is completed, replacing the precision mask plate corresponding to another subpixel (e.g., a G subpixel or a B subpixel), until the compensations of the precision mask plate corresponding to the three subpixels are completed. Therefore, the vapor deposition machine can automatically mass production operations, to produce a color screen, and to ensure that the production of the screen does not occur color mixing effect.

Figure 2:
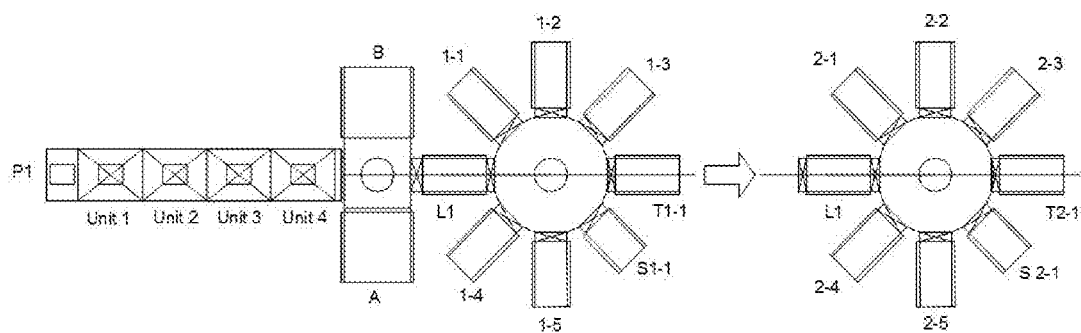
FIG. 2 is a structural illustration of a vapor deposition machine in general technology.

Referring to FIG. 2, FIG. 2 is a structural illustration of a vapor deposition machine in general technology. The substrate to be operated (not shown in figure) or the deposition substrate (not shown in figure) is supplied from the cleaner port P1, after a plurality of cleaning units (four cleaning units such as Unit1, Unit2, Unit3, Unit4 are shown in FIG. 2), entering the baking unit A, and cooling in the chamber B. Then, the substrate to be operated or the deposition substrate is subjected to environmental conversion in the L1 chamber, converting the atmospheric environment into a vacuum environment, all chambers after the L1 chamber are in a vacuum state. Wherein, chambers 1-1 to 1-5,2-1 to 2-5 are the vapor deposition chambers, and a part of the chamber are loaded with precision mask plate, and S1-1, S2-1 are the precision mask plate loading chamber.

A description will be given of an example of a precision mask plate corresponding to the red-light subpixel loaded in a vapor deposition chamber 1-2.

The precision mask plate corresponding to the red-light subpixel is transferred from the S1-1 to the vapor deposition chamber 1-2 by a mechanical arm, a commissioning substrate is supplied from the P1 port, after cleaning, baking, and cooling, entering the L1 chamber into a vacuum environment. The mechanical arm sends the commissioning substrate to the vapor deposition chamber 1-2 to start the coating compensation for commissioning the precision mask plate corresponding to the red-light subpixel. The commissioning substrate is withdrawn via the S1-1 after commissioning, then calculating the compensation value of the precision mask plate corresponding to the red-light subpixel after measuring the surface pattern of the commissioning substrate, and then commissioning again. When the compensation for commissioning the precision mask plate corresponding to the red-light subpixel is completed, performing the compensation for commissioning the precision mask plate corresponding to the green-light subpixel and the blue-light subpixel in accordance with the above-described procedure, until compensation of the precision mask plate corresponding to the all three subpixels is completed.

In the long-term study, the inventors of the present invention have found that the above-mentioned compensation for commissioning method has the following drawbacks.

(1) Waste of the material for film-forming: the above-mentioned compensation for commissioning method must use the material for film-forming (usually an organic material), and each precision mask plate must be commissioned by 3-5 pieces of commissioning substrate to complete the commissioning. For a product, it probably need to use 27-75 pieces of commissioning substrate in the commissioning process, so as to waste of the material for film-forming, and the material for film-forming is expensive.

(2) Commissioning speed is slow: in the process of commissioning, it needs to experience material warming, rate stability, film forming by deposition, membrane pattern measurement, calculation and other processes. For a product, compensation for commissioning the precision mask plate needs to consume 400 to 1000 minutes.

(3) Occupies the vapor deposition chamber of vapor deposition machine: each vapor deposition machine has 3-5 vapor deposition chambers, when using the above-mentioned method to compensate for commissioning the precision mask plate, it must occupy the red, green, blue vapor deposition chamber, making the entire production line cannot carry out the normal product operations. The vapor deposition machine must wait for compensating for commissioning the precision mask, to start normal manufacturing operations.

Therefore, the present invention provides a commissioning method and a vapor deposition machine. Technical implementation will be described below clearly and fully by combining with drawings made in accordance with an embodiment in the present invention. Obviously, the described embodiments are merely part of embodiment of the present invention, not at all. Based on the embodiments of the present invention, on the premise of embodiments in the absence of creative work, all other embodiments are in the scope of protection in the present invention.

Figure 3:
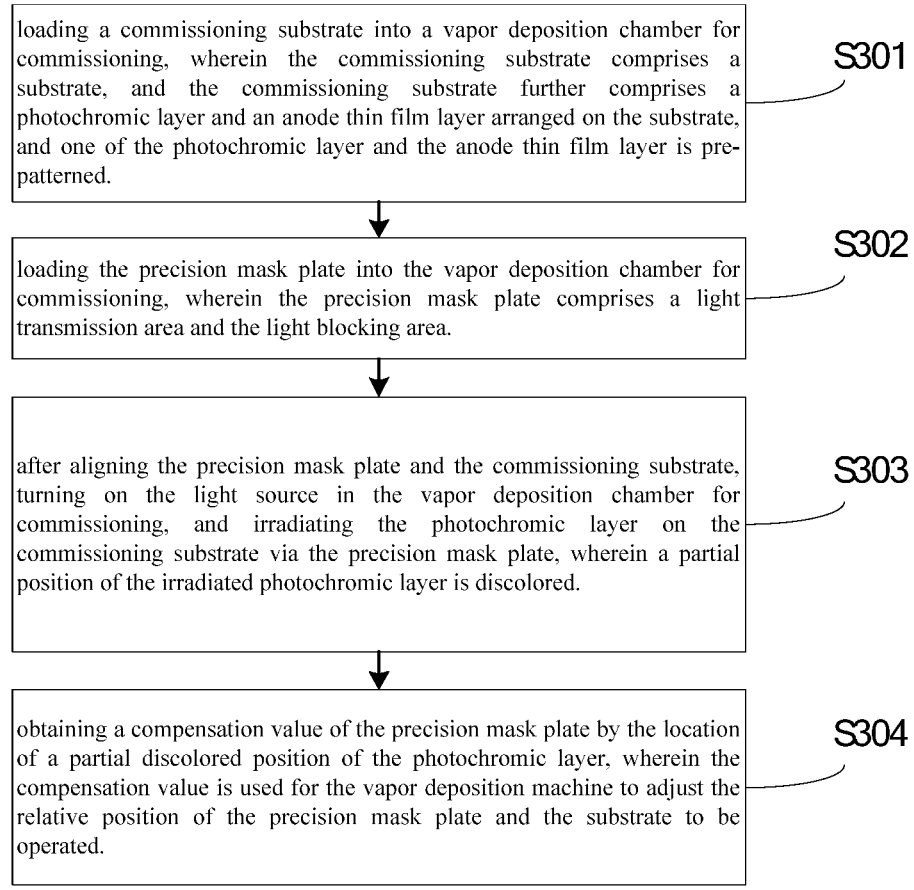
FIG. 3 is a flow chart of a commissioning method in accordance with an embodiment in the present invention.

Referring to FIG. 3, FIG. 3 is a flow chart of a commissioning method in accordance with an embodiment in the present invention, the method is used for adjusting the relative position of a precision mask plate and a substrate to be operated, which comprise:

S301: loading a commissioning substrate into a vapor deposition chamber for commissioning, wherein the commissioning substrate comprises a substrate, and the commissioning substrate further comprises a photochromic layer and an anode thin film layer arranged on the substrate, and one of the photochromic layer and the anode thin film layer is pre-patterned.

Figure 4:
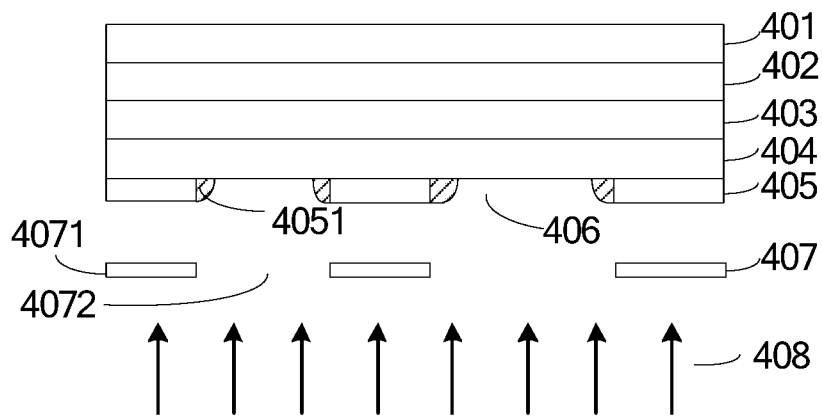
FIG. 4 is an illustrational view of a commissioning substrate and a precision mask plate during the commissioning process of the commissioning method in FIG. 3 in an application scenario.

Referring to FIG. 4, in an application scenario of the present embodiment, when the photochromic layer 405 on the commissioning substrate is pre-patterned, the patterned photochromic layer 405 is arranged on the anode thin film layer 404.

Optionally, in this application scenario, the commissioning substrate also comprises a substrate 401, a buffer layer 402, and a metal layer 403, wherein the substrate 401, the buffer layer 402, and the metal layer 403 correspond to the same or similar to the substrate 101, the buffer layer 102, and the metal layer 103 of the general commissioning substrate, therefore no additional description is given herebelow, please referring the above-mentioned description.

Wherein, the specific description that the patterned photochromic layer 405 is arranged on the anode thin film layer 404, is that the patterned photochromic layer 405 is arranged on the side of the anode thin film layer 404 away from the substrate 401. The photochromic layer 405 undergoes processes such as coating, baking, exposure, development, etc., and an opening 406 is formed to restrict the anode pattern required to form the anode film layer 404. The positions of the opening 406 and the anode pattern required to form the anode film layer 404 are the same.

Optionally, the photochromic layer 405 is formed of a photochromic material, or a photoresist layer containing a photochromic material. When the photochromic layer 405 is a photoresist layer containing a photochromic material, first, doping the photochromic material into a chemical solution of the photoresist layer, and then forming a thin film layer by the liquid coating method (of course, it may also use other known methods such as physical vapor deposition, chemical vapor deposition, spray coating, dip coating, dip-spin coating and the like), the thin film layer undergoes processes such as baking, exposure, development, etc., an opening 406 is formed to restrict the anode pattern required to form the anode film layer 404. When the photochromic layer 405 is formed of a photochromic material, first, forming the photochromic material into a stable solution, and then forming a thin film layer by the liquid coating method (of course, it may also use other known methods such as physical vapor deposition, chemical vapor deposition, spray coating, dip coating, dip-spin coating and the like), the thin film layer undergoes processes such as baking, exposure, development, etc., an opening 406 is formed to restrict the anode pattern required to form the anode film layer 404.

Wherein, the photochromic material comprises at least one of an inorganic photochromic material and an organic photochromic material. For example, the photochromic material may be an inorganic photochromic material, or an organic photochromic material, or including both an inorganic photochromic material and an organic photochromic material. Specifically, the inorganic photochromic material may be molybdenum oxide, titanium oxide, calcium iodide, mercuric iodide, cupric chloride, silver chloride, etc., and the organic photochromic material may be a chromene compound, spiropyran, spirooxazine, stilbene, aromatic azo compounds, bisimidazoles, spiro dihydroxyindoline, triarylmethane, diarylethene, azobenzene and the like have been known as organic photochromic materials. Optionally, in the application scenario, in order to improve color forming concentration, initial coloring, fading speed controlling, film-forming properties, etc., the photochromic material is added with at least one of a surfactant, an antioxidant, an ultraviolet absorber and a viscosity improving agent. Of course, other additives may also be added in other application scenarios, it should be noticed that the addition of these additives can use unidentified known compounds.

In the above-mentioned application scenario, the photochromic layer 405 needs to undergo five processes of coating, baking, exposure, development, and baking to form the structure shown in FIG. 4. Since the photochromic layer 405 contains a photochromic material, it is necessary to adjust and verify in each step, so that the operation is troublesome. The production process may be greatly changed because of the commissioning substrate, so that adding the commissioning substrate into the production process is disadvantageous. Therefore, in order to improve this defect, referring to FIG. 5, in another application scenario of the present embodiment, when the anode thin film layer 505 on the commissioning substrate is pre-patterned, the patterned anode thin film layer 505 is arranged on the photochromic layer 504.

The same, in this application scenario, the commissioning substrate also comprises a substrate 501, a buffer layer 502, and a metal layer 503, wherein the substrate 501, the buffer layer 502, and the metal layer 503 correspond to the same or similar to the substrate 101, the buffer layer 102, and the metal layer 103 of the general commissioning substrate, therefore no additional description is given herebelow, please referring the above-mentioned description.

Wherein, the specific description that the patterned anode thin film layer 505 is arranged on the photochromic layer 504, is that the patterned anode thin film layer 505 is arranged on the side of the photochromic layer 504 away from the substrate 501. The photochromic layer 504 is a complete layer of film at this time, which undergoes only two processes of coating and baking, then can be formed. Comparing to the above-mentioned application scenario, in the present application scenario, the process of the photochromic layer 504 can be reduced from five to two, and cost can be effectively reduced, and the time is saved.

In the application scenario, the anode thin film layer 505 is patterned to form a plurality of anode patterns 5051. In this application scenario, the plurality of anode patterns 5051 coincide with the size and position of the openings 406 in the application scenario described above.

In the above-mentioned two application scenarios, the anode thin film layer 404 and the anode thin film layer 505 may be a multilayer film formed of indium tin oxide and metallic silver. Optionally, in order to further reduce the cost, in other embodiments, the anode film layer 404 and the anode film layer 505 may be a conventional metal thin film layer, such as a metal molybdenum film layer, and of course other metal material layers, it is not limited here.

S302: loading the precision mask plate into the vapor deposition chamber for commissioning, wherein the precision mask plate comprises a light transmission area and the light blocking area.

The precision mask plate comprises a light transmission area and the light blocking area, so that the irradiation light can pass through the light transmission area and irradiate the photochromic layer of the commissioning substrate. For example, in the application scenario of FIG. 4, the precision mask plate 407 comprises a light blocking area 4071 and a light transmission area 4072; and in the application scenario of FIG. 5, the precision mask plate 507 comprises a light blocking area 5071 and a light transmission area 5072.

S303: after aligning the precision mask plate and the commissioning substrate, turning on the light source in the vapor deposition chamber for commissioning, and irradiating the photochromic layer on the commissioning substrate via the precision mask plate, wherein a partial position of the irradiated photochromic layer is discolored.

The vapor deposition chamber for commissioning comprises a light source, the light source can cause discoloration in a portion where the photochromic layer is irradiated. Optionally, in the present embodiment, the light source may be an ultraviolet lamp, which can emit ultraviolet light, but there is no restriction on the wavelength of the ultraviolet light. Of course, in other embodiments, the light source may be any light source which can cause discoloration in the photochromic layer.

When turning on the light source in the vapor deposition chamber for commissioning, the light emitted from the light source irradiates the photochromic layer on the commissioning substrate via the precision mask plate, and a partial position of the irradiated photochromic layer is discolored. For example, in the application scenario of FIG. 4, the irradiation light 408 emitted from the light source (not shown in FIG. 4) passing through the light transmission area 4072 in the precision mask plate 407 and irradiating the patterned photochromic layer 405, so that the discoloration phenomenon is occurred in where the photochromic layer 405 corresponds to a partial position 4051 in the light transmission area 4072 of the precision mask plate 407, as shown in FIG. 4, the discoloration phenomenon occurs in the photochromic layer 405 is a partial position 4051 between the edge of the light transmissive area 4072 of the precision mask plate 408 and the edge of the patterned photochromic layer 405; in the application scenario of FIG. 5, the irradiation light 508 emitted from the light source (not shown in FIG. 5) passing through the light transmission area 5072 in the precision mask plate 507 and the patterned anode thin film layer 505, and irradiating the photochromic layer 504, so that the discoloration phenomenon is occurred in a partial position 5041 of the irradiated photochromic layer 504, as shown in FIG. 5, the discoloration phenomenon occurs in the photochromic layer 504 is a partial position 5041 between the edge of the light transmissive area 5072 of the precision mask plate 507 and the edge of the patterned anode thin film layer 505.

S304: obtaining a compensation value of the precision mask plate by the location of a partial discolored position of the photochromic layer, wherein the compensation value is used for the vapor deposition machine to adjust the relative position of the precision mask plate and the substrate to be operated.

Figure 5:
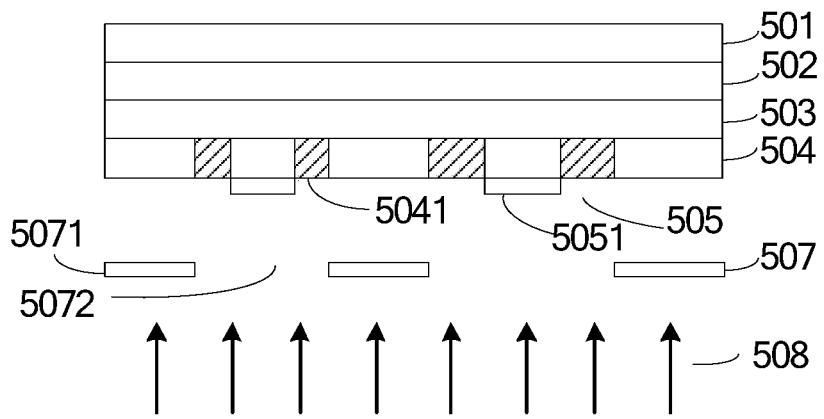
FIG. 5 is an illustrational view of a commissioning substrate and a precision mask plate during the commissioning process of the commissioning method in FIG. 3 in another application scenario.

Specifically, in the application scenario of FIG. 4, after the step S303, measuring the distance between the partial discolored position 4051 in the photochromic layer 405 and the four sides of the opening 406, and calculating a compensation value of the corresponding precision mask plate by a certain algorithm, the vapor deposition machine adjusts the relative position of the precision mask plate and the substrate to be operated in accordance with the compensation value; in the application scenario of FIG. 5, after the step S303, measuring the distance between the partial discolored position 5041 in the photochromic layer 504 and the four sides of the anode patterns 5051, and calculating a compensation value of the corresponding precision mask plate by a certain algorithm, the vapor deposition machine adjusts the relative position of the deposition mask plate and the substrate to be operated in accordance with the compensation value.

Wherein, optionally, the specific description that the vapor deposition machine adjusts the relative position of the precision mask plate and the substrate to be operated in accordance with the compensation value, which comprises: When the compensation value does not exceed the default threshold, the vapor deposition machine adjusts the relative position of the precision mask plate and the substrate to be operated; when the compensation value exceeds the default threshold, repeating steps S301 to S303 until the acquired compensation value does not exceed the preset threshold, so as to ensure that when the produced display panel is lit, it does not occur color mixing effect.

In the above-mentioned commissioning method of the embodiment, by obtaining a compensation value of precision mask plate by the location of a partial discolored position of the photochromic layer in the commissioning substrate, and then the vapor deposition machine adjusts the relative position of a precision mask plate and a substrate to be operated by the compensation value. The method is different from the prior art that it does not need to form an organic film pattern by deposition during commissioning, therefore, by the method, it is possible to omit expensive organic materials during the commissioning process and increase the commissioning speed.

Figure 6:
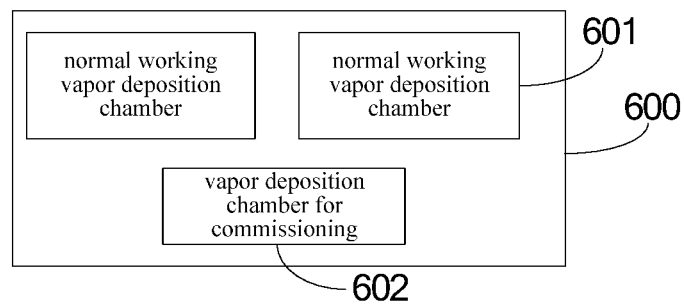
FIG. 6 is a structural illustration of a vapor deposition machine in accordance with an embodiment in the present invention.

The present invention is further to provide a vapor deposition machine. Referring to FIG. 6, FIG. 6 is a structural illustration of a vapor deposition machine in accordance with an embodiment in the present invention. The vapor deposition machine 600 comprises a plurality of normal working vapor deposition chambers 601 and at least one vapor deposition chamber 602 for commissioning, wherein the vapor deposition chamber 602 for commissioning is used to obtain a compensation value of precision mask plate, and the compensation value is for the vapor deposition machine 601 to adjust the relative position of the precision mask plate and the substrate to be operated in the normal working vapor deposition chamber The normal working vapor deposition chamber 601 means that the vapor deposition chamber is the same as the vapor deposition chamber of the conventional vapor deposition machine, for example, which is the same as the vapor deposition chambers 1-1 to 1-5, 2-1 to 2-5 in FIG. 2, the vapor deposition chamber has the traditional vapor deposition function. It should be noticed that, the number of the normal working vapor deposition chamber 601 is not limited, and the relative positions of the vapor deposition chamber 602 for commissioning and the normal working vapor deposition chamber 601 are not limited.

Figure 7:
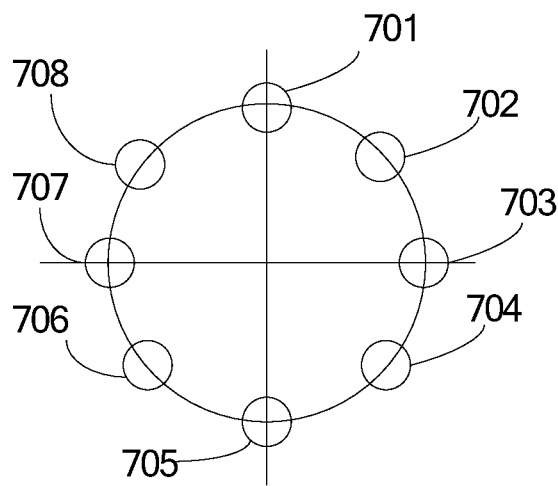
FIG. 7 is a part of structural illustration of a vapor deposition chamber for commissioning in accordance with an embodiment in FIG. 6.

Referring to FIG. 7, FIG. 7 is a part of structural illustration of a vapor deposition chamber for commissioning in accordance with an embodiment in FIG. 6. Wherein at least one light source is arranged in the vapor deposition chamber for commissioning, in FIG. 7, take four light sources for example, i.e., a light source 701, a light source 703, a light source 705, and a light source 707 in FIG. 7. Optionally, the light source 701, the light source 703, the light source 705, and the light source 707 are arranged in the lower portion of the vapor deposition chamber for commissioning, an alignment system for adjust the relative position of the precision mask plate and the commissioning substrate is arranged in the vapor deposition chamber for commissioning (not shown in FIG. 7), and a rotating mechanism is arranged in the upper portion of the vapor deposition chamber for commissioning (not shown in FIG. 7). When the commissioning substrate and the precision mask plate are loaded into the vapor deposition chamber for commissioning sequentially, and after the commissioning substrate is aligned with the precision type mask plate, the rotation mechanism rotates at a constant speed, and the photochromic layer on the substrate is irradiated with the irradiation light emitted from the light source 701, the light source 703, the light source 705, and the light source 707, a partial position of the irradiated photochromic layer is discolored, so as that the vapor deposition chamber for commissioning obtain a compensation value of the precision mask plate by the location of a partial discolored position of the photochromic layer. Wherein, the method of the vapor deposition chamber for commissioning obtains a compensation value of precision mask plate, to adjust the relative position of the precision mask plate and the substrate to be operated (or the commissioning substrate), is the same or similar to the commissioning method in any one of the above-mentioned embodiments, therefore no additional description is given herebelow, please referring the above-mentioned description.

Optionally, in the present embodiment, at least one material evaporation source is arranged in the vapor deposition chamber for the commissioning, in FIG. 7, take four material evaporation sources for example, i.e., a material evaporation source 702, a material evaporation source 704, a material evaporation source 706, and a material evaporation source 708. So that the vapor deposition chamber for the commissioning also has the traditional vapor deposition function, i.e., when the precision mask plate is not required to be compensated for commissioning, the vapor deposition chamber for the commissioning can also be used for subjecting the substrate to be operated to a vapor deposition operation.

It should be noticed that, in the present embodiment, the number and the positional relationship of the light source and the material evaporation source are not limited, illustration in FIG. 7 is used for explaining, and the relative positional relationship in FIG. 7 is not limited. The light source and material evaporation source type is also not limited, it is only to need to emit irradiation light by the light source and material evaporation source which is met the requirements.

In the present embodiment, the vapor deposition machine comprises a plurality of normal working vapor deposition chambers and at least one vapor deposition chamber for commissioning. In the normal operation of the substrate to be operated, several normal working evaporation chambers and vapor deposition chamber for commissioning can be used to coat the substrate to be operated. When the precision mask plate needs compensation for commissioning, it can switch the vapor deposition machine to semi-automatic mode. The normal working vapor deposition chambers coat the substrate to be operated, and the vapor deposition chamber for commissioning obtains compensation value of the precision mask plate, the two do not interfere with each other, it will not affect the production line of normal coating operations. The equipment utilization can be increased, and can help to reduce production costs.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. A commissioning method for adjusting the relative position of a precision mask plate and a substrate to be operated, which comprises:
   Loading a commissioning substrate into a vapor deposition chamber for commissioning, wherein the commissioning substrate comprises a substrate, and the commissioning substrate further comprises a photo chromic layer and an anode thin film layer arranged on the substrate, and one of the photo chromic layer and the anode thin film layer is pre-patterned;
   loading the precision mask plate into the vapor deposition chamber for commissioning, wherein the precision mask plate comprises a light transmission area and the light blocking area;
   after aligning the precision mask plate and the commissioning substrate, turning on a light source in the vapor deposition chamber for commissioning, and irradiating the photo chromic layer on the commissioning substrate via the precision mask plate, wherein a partial position of the irradiated photo chromic layer is discolored;
   obtaining a compensation value of the precision mask plate by the location of a partial discolored position of the photo chromic layer, wherein the compensation value is used for the vapor deposition machine to adjust the relative position of the precision mask plate and the substrate to be operated;
   wherein when the photo chromic layer on the commissioning substrate is pre-patterned, the patterned photo chromic layer is arranged on the anode thin film layer; the above-mentioned description of turning on the light source in the vapor deposition chamber for commissioning and irradiating the photo chromic layer on the commissioning substrate via the precision mask plate, which comprises: the irradiation light passing through the light transmission area in the precision mask plate and irradiating the patterned photo chromic layer, so that the discoloration phenomenon is occurred in the position corresponding to the light transmission area in the patterned photo chromic layer; wherein the position where the discoloration phenomenon occurs in the photo chromic layer is a position between the edge of the light transmissive area of the precision mask plate and the edge of the patterned photo chromic layer;
   wherein when the anode thin film layer on the commissioning substrate is pre-patterned, the patterned anode thin film layer is arranged on the photo chromic layer; the above-mentioned description of turning on the light source in the vapor deposition chamber for commissioning and irradiating the photo chromic layer on the commissioning substrate via the precision mask plate, which comprises: the irradiation light passing through the light transmission area in the precision mask plate and the patterned anode thin film layer, and irradiating the photo chromic layer, so that the discoloration phenomenon is occurred in a partial position of the irradiated photo chromic layer; wherein the discoloration phenomenon occurs in the photo chromic layer is a position between the edge of the light transmissive area of the precision mask plate and the edge of the patterned anode thin film layer.

2. The commissioning method as recited in claim 1, wherein the photo chromic layer is formed of a photo chromic material, or a photo resist layer containing a photo chromic material.

3. The commissioning method as recited in claim 2, wherein the photo chromic material comprises at least one of an inorganic photo chromic material and an organic photo chromic material.

4. The commissioning method as recited in claim 3, wherein the photo chromic material is added with at least one of a surfactant, an antioxidant, an ultraviolet absorber and a viscosity improving agent.

5. A commissioning method for adjusting the relative position of a precision mask plate and a substrate to be operated, which comprises:
   loading a commissioning substrate into a vapor deposition chamber for commissioning, wherein the commissioning substrate comprises a substrate, and the commissioning substrate further comprises a photo chromic layer and an anode thin film layer arranged on the substrate, and one of the photo chromic layer and the anode thin film layer is pre-patterned;
   loading the precision mask plate into the vapor deposition chamber for commissioning, wherein the precision mask plate comprises a light transmission area and the light blocking area;
   after aligning the precision mask plate and the commissioning substrate, turning on a light source in the vapor deposition chamber for commissioning, and irradiating the photo chromic layer on the commissioning substrate via the precision mask plate, where in a partial position of the irradiated photo chromic layer is discolored;

obtaining a compensation value of the precision mask plate by the location of a partial discolored position of the photo chromic layer, wherein the compensation value is used for the vapor deposition machine to adjust the relative position of the precision mask plate and the substrate to be operated.

6. The commissioning method as recited in claim 5, wherein when the photo chromic layer on the commissioning substrate is pre-patterned, the patterned photo chromic layer is arranged on the anode thin film layer; wherein the above-mentioned description of turning on the light source in the vapor deposition chamber for commissioning and irradiating the photo chromic layer on the commissioning substrate via the precision mask plate, which comprises:

the irradiation light passing through the light transmission area in the precision mask plate and irradiating the patterned photo chromic layer, so that the discoloration phenomenon is occurred in the position corresponding to the light transmission area in the patterned photo chromic layer; wherein the position where the discoloration phenomenon occurs in the photo chromic layer is a position between the edge of the light transmissive area of the precision mask plate and the edge of the patterned photo chromic layer.

7. The commissioning method as recited in claim 5, wherein when the anode thin film layer on the commissioning substrate is pre-patterned, the patterned anode thin film layer is arranged on the photo chromic layer; wherein the above-mentioned description of turning on the light source in the vapor deposition chamber for commissioning and irradiating the photo chromic layer on the commissioning substrate via the precision mask plate, which comprises:

the irradiation light passing through the light transmission area in the precision mask plate and the patterned anode thin film layer, and irradiating the photo chromic layer, so that the discoloration phenomenon is occurred in a partial position of the irradiated photo chromic layer; wherein the discoloration phenomenon occurs in the photo chromic layer is a position between the edge of the light transmissive area of the precision mask plate and the edge of the patterned anode thin film layer.

8. The commissioning method as recited in claim 5, wherein the photo chromic layer is formed of a photo chromic material, or a photo resist layer containing a photo chromic material.

9. The commissioning method as recited in claim 8, wherein the photo chromic material comprises at least one of an inorganic photo chromic material and an organic photo chromic material.

10. The commissioning method as recited in claim 9, wherein the photo chromic material is added with at least one of a surfactant, an antioxidant, an ultraviolet absorber and a viscosity improving agent.

\* \* \* \* \*